United States Patent
Doi et al.

(10) Patent No.: US 9,869,014 B2
(45) Date of Patent: Jan. 16, 2018

(54) FORMATION OF AN ALIGNMENT FILM FOR A LIQUID CRYSTAL ON A SUBSTRATE

(71) Applicant: International Business Machines Corporation, Armonk, NY (US)

(72) Inventors: Shoichi Doi, Shiga (JP); Tatsuya Nishiwaki, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 14/628,356

(22) Filed: Feb. 23, 2015

(65) Prior Publication Data

US 2015/0167150 A1    Jun. 18, 2015

Related U.S. Application Data

(63) Continuation of application No. 12/174,897, filed on Jul. 17, 2008.

(30) Foreign Application Priority Data

Aug. 22, 2007  (JP) .................................. 2007-215494

(51) Int. Cl.
*C23C 14/22*      (2006.01)
*C23C 14/34*      (2006.01)
(Continued)

(52) U.S. Cl.
CPC .......... *C23C 14/221* (2013.01); *C23C 14/042* (2013.01); *C23C 14/0605* (2013.01);
(Continued)

(58) Field of Classification Search
CPC .............. C23C 14/225; C23C 14/5833; C23C 14/221; C23C 14/0605; C23C 14/042;
(Continued)

(56) References Cited

U.S. PATENT DOCUMENTS

| 4,911,809 A | 3/1990 | Wort et al. |
| 5,080,455 A * | 1/1992 | King ....................... C03C 17/22 204/192.11 |

(Continued)

FOREIGN PATENT DOCUMENTS

| JP | 215161 | 1/1990 |
| JP | 36373 | 1/1991 |

(Continued)

OTHER PUBLICATIONS

Notice of Allowance (dated Jan. 2, 2015) for U.S. Appl. No. 12/174,897, filed Jul. 17, 2008, Conf. No. 9619.

(Continued)

*Primary Examiner* — Michael Band
(74) *Attorney, Agent, or Firm* — Schmeiser, Olsen & Watts, LLP; John Pivnichny

(57) ABSTRACT

A method for forming an alignment film for a liquid crystal on a substrate and an associated at least one structure. The substrate is moved in a first direction. A target is disposed on the first surface side of the substrate. The ion beam is propagated from an ion source toward the substrate and impinges on a sputtering surface of the target, which sputters a material of the target and results in sputtered particles of the material being emitted from the sputtering surface of the target and deposited on the first surface side of the substrate to form (i) a sputtering film on the first surface side of the substrate and (ii) an alignment film having an orientation and being disposed on the sputtering film and on the entire surface of the substrate. The alignment film aligns molecules of the liquid crystal in a predetermined direction.

6 Claims, 2 Drawing Sheets

(51) Int. Cl.
*C23C 14/46* (2006.01)
*C23C 14/04* (2006.01)
*C23C 14/06* (2006.01)
*H01J 37/34* (2006.01)
*G02F 1/1337* (2006.01)

(52) U.S. Cl.
CPC ........ *C23C 14/225* (2013.01); *C23C 14/3442* (2013.01); *C23C 14/46* (2013.01); *G02F 1/13378* (2013.01); *G02F 1/133734* (2013.01); *H01J 37/3411* (2013.01); *H01J 37/3426* (2013.01); *H01J 2237/3146* (2013.01)

(58) Field of Classification Search
CPC .. C23C 14/3442; C23C 14/46; H01J 37/3426; H01J 2237/3146; G02F 1/133734; G02F 1/13378
See application file for complete search history.

(56) References Cited

U.S. PATENT DOCUMENTS

| | | | |
|---|---|---|---|
| 5,770,826 A | | 6/1998 | Chaudhari et al. |
| H1933 H | * | 1/2001 | Zabinski ................. C23C 14/28 204/298.19 |
| 6,593,586 B2 | | 7/2003 | Chaudhari et al. |
| 6,632,483 B1 | * | 10/2003 | Cesare Callegari ....................... C23C 14/0605 204/192.15 |
| 6,783,635 B2 | | 8/2004 | Pinarbasi |
| 7,184,116 B2 | | 2/2007 | Kamiya et al. |
| 7,525,107 B2 | | 4/2009 | Nakagaki et al. |
| 2002/0005347 A1 | * | 1/2002 | Sferlazzo .............. C23C 14/044 204/192.1 |
| 2009/0050469 A1 | | 2/2009 | Doi et al. |

FOREIGN PATENT DOCUMENTS

| | | |
|---|---|---|
| JP | 2000192235 A * | 7/2000 |
| JP | 2003-222873 | 8/2003 |
| JP | 2004205586 | 7/2004 |
| JP | 2005-084145 | 3/2005 |
| JP | 2006-047724 | 2/2006 |
| JP | 2006227533 | 8/2006 |
| JP | 2007163711 | 6/2007 |
| WO | 9810115 | 3/1998 |

OTHER PUBLICATIONS

RCE (dated Dec. 12, 2014) for U.S. Appl. No. 12/174,897, filed Jul. 17, 2008, Conf. No. 9619.
Advisory Action (dated Dec. 12, 2014) for U.S. Appl. No. 12/174,897, filed Jul. 17, 2008, Conf. No. 9619.
Final Amendment (dated Dec. 3, 2014) for U.S. Appl. No. 12/174,897, filed Jul. 17, 2008, Conf. No. 9619.
Final Office Action (dated Oct. 9, 2014) for U.S. Appl. No. 12/174,897, filed Jul. 17, 2008, Conf. No. 9619.
Amendment (dated Sep. 23, 2014) for U.S. Appl. No. 12/174,897, filed Jul. 17, 2008, Conf. No. 9619.
Office Action (dated Jun. 25, 2014) for U.S. Appl. No. 12/174,897, filed Jul. 17, 2008, Conf. No. 9619.
RCE (dated Feb. 17, 2012) for U.S. Appl. No. 12/174,897, filed Jul. 17, 2008, Conf. No. 9619.
Final Office Action (dated Nov. 23, 2011) for U.S. Appl. No. 12/174,897, filed Jul. 17, 2008, Conf. No. 9619.
Amendment (dated Nov. 1, 2011) for U.S. Appl. No. 12/174,897, filed Jul. 17, 2008, Conf. No. 9619.
Restriction Requirement (dated Oct. 4, 2011) for U.S. Appl. No. 12/174,897, filed Jul. 17, 2008, Conf. No. 9619.
Amendment (dated Aug. 9, 2011) for U.S. Appl. No. 12/174,897, filed Jul. 17, 2008, Conf. No. 9619.
Office Action (dated May 11, 2011) for U.S. Appl. No. 12/174,897, filed Jul. 17, 2008, Conf. No. 9619.

* cited by examiner

FORMATION OF AN ALIGNMENT FILM FOR A LIQUID CRYSTAL ON A SUBSTRATE

This application is a continuation application claiming priority to Ser. No. 12/174,897, filed Jul. 17, 2008, now U.S. Pat. No. 9,034,151, issued May 19, 2015.

FIELD OF THE INVENTION

The present invention relates to an alignment film forming apparatus and method, and more particularly, to an alignment film forming apparatus and method which form an alignment film for a liquid crystal on a substrate using ion beam sputtering.

BACKGROUND OF THE INVENTION

A liquid crystal display is configured to have a liquid crystal held between transparent substrates of glass or the like. An alignment film is formed on each transparent substrate. The alignment film serves to align liquid crystal molecules in a predetermined direction, and is formed by applying a film of polyimide or the like and rubbing the film in one direction with a buff cloth. Rubbing is the most ordinary alignment scheme but with this technique it is difficult to provide uniform orientation while easily providing strong alignment restricting force.

An ion beam method is receiving attention as a new alignment technique in place of the rubbing method. The ion beam method provides alignment by accelerating ions of argon or the like with high voltage and irradiating an ion beam on a film of DLC (Diamond Like Carbon) or the like in an oblique direction. Contrary to the rubbing method, when using the ion beam method it is difficult to provide strong alignment restricting force while easily providing uniform orientation.

In case of forming an alignment film by the ion beam method, film deposition and alignment are separate processes (see Patent Documents 1 to 3 mentioned below). Therefore, two apparatuses, a film deposition apparatus and an alignment apparatus, are needed. This raises various problems, such as making the overall apparatus more expensive, the need for a wider apparatus installing space and the need for a rinsing process between the film deposition process and the alignment process.

For example, Japanese Unexamined Patent Publication (Kokai) No. 2003-222873 describes a method of executing an alignment process by forming a DLC film with magnetron sputtering, and then irradiating an argon ion beam on the DLC film while transferring a substrate. Japanese Unexamined Patent Publication (Kokai) No. 2006-047724 describes a method of executing an alignment process by irradiating an ion beam on a DLC film while transferring a substrate, but fails to give a detailed description of a film deposition process. In addition, an apparatus described in Patent Document 2 transfers a substrate from an upstream side to a downstream side, with masks provided on both the upstream and downstream sides. Japanese Unexamined Patent Publication (Kokai) No. 2006-284887 describes a method of executing an alignment process by forming a DLC film with plasma sputtering or CVD (Chemical Vapor Deposition) and then irradiating an ion beam on the DLC film while transferring a substrate.

Japanese Unexamined Patent Publication (Kokai) No. 2005-084145 (the 084145) describes a method of forming an alignment film in a single process of simultaneously executing a film deposition process and an alignment process by using ion beam sputtering. According to the method, an ion beam is irradiated on a target such as $SiO_2$, so that sputtering particles sputtered from the target are irradiated on a substrate at an incidence angle $\theta s$. As a result, a columnar crystal is grown in a direction tilted by $\theta s$, thereby forming an alignment film. However, this method can form an alignment film only on a relatively small substrate. This is because with the positional relationship shown in the publication, a substrate if large, blocks an ion beam irradiated on a target from an ion source. In general, an ion beam and sputtering particles generated by the ion beam have certain spread irradiation ranges, which become wider because the distance between the ion source and the target is long according to the disclosed invention. Although paragraph 0036 of the 084145 document suggests movement of a substrate in such a way that the incidence angle becomes $\theta s$ wile irradiating sputtering particles, it appears from the foregoing circumstance that an alignment film shall be formed only on a very small substrate.

Japanese Unexamined Patent Publication (Kokai) No. 2002-062532 describes a method of forming an alignment film in a single process of a simultaneously executing a film deposition process and alignment process by using ion beam sputtering. According to the method, a substrate is bombarded with an ion beam at a predetermined incidence angle, and at the same time, while a film is deposited on the substrate, the atomic structure of the film is aligned in a predetermined alignment direction, but no sputtering is performed.

Japanese Unexamined Patent Publication (Kokai) No. 2002-055348 describes a method of forming an alignment film in a single process of simultaneously executing a film deposition process and an alignment process by using magnetron sputtering. According to the method, a carbon film is deposited on a substrate with a magnetic field acting thereon, but no ion beam is used.

SUMMARY OF THE INVENTION

According to an embodiment of the present invention, there is provided an apparatus for forming an alignment film on a substrate using ion beam sputtering, comprising a target disposed on a first surface side of the substrate, the target having a sputtering surface defining an angle relative to the first surface side of the substrate, a transfer unit adapted to transfer the substrate in a direction opposite to a direction in which a normal direction of the sputtering surface is projected on the first surface side of the substrate, and an ion source disposed on the first surface side of the substrate in such a way that when an ion beam is irradiated on the sputtering surface of the target, the ion beam reflected at the sputtering surface is irradiated on a sputtering film formed on the substrate.

According to another embodiment of the present invention, there is provided a method for forming an alignment film on a substrate by using ion beam sputtering, comprising the steps of disposing a target on a first surface side of the substrate in such a way that a sputtering surface of the target defines an angle with the first surface side of the substrate, disposing an ion source that generates an ion beam on the first surface side of the substrate, and causing the ion source to irradiate an ion beam on the sputtering surface of the target and irradiating an ion beam reflected at the sputtering surface on a sputtering film formed on the substrate while transferring the substrate in a direction opposite to a direction in which a normal direction of the sputtering surface is projected on the first surface side of the substrate.

DETAILED DESCRIPTION OF THE INVENTION

Figure 1:
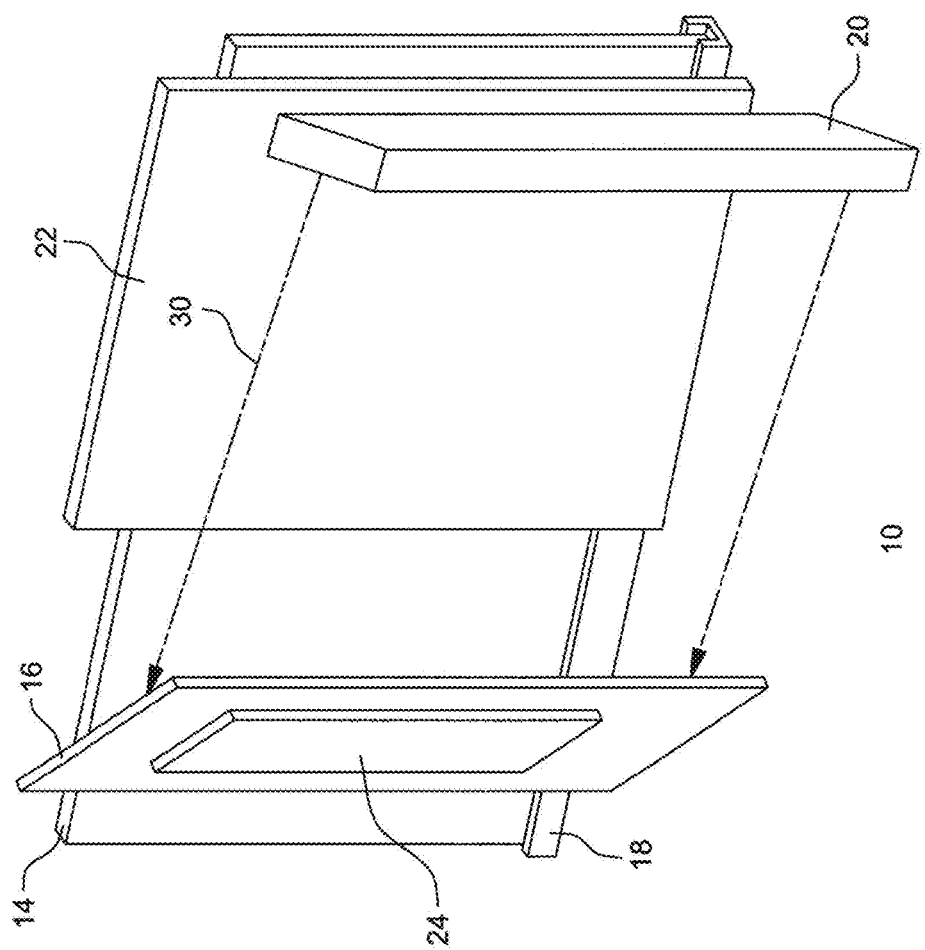
FIG. 1 is a perspective view showing the configuration of an alignment film forming apparatus according to one embodiment of the present invention.

An embodiment of the present invention will be described in detail below by referring to the accompanying drawings. Same reference numerals are given to like or same components in the diagrams to avoid repeating their redundant descriptions.

Figure 2:
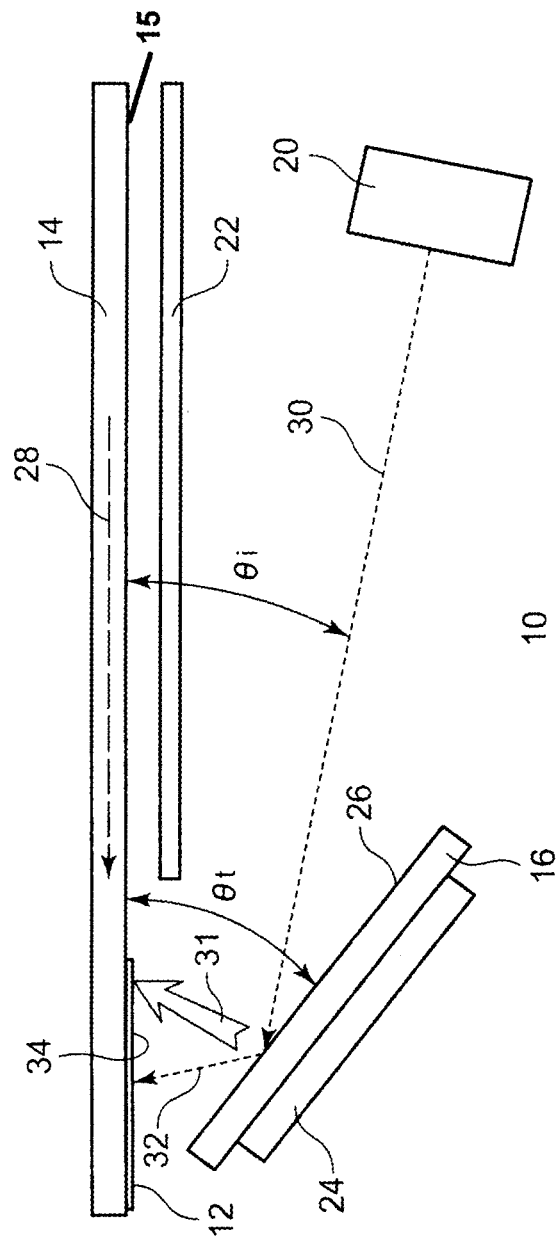
FIG. 2 is a top view of the alignment film forming apparatus shown in FIG. 1.

Referring to FIGS. 1 and 2, an alignment film forming apparatus 10 according to one embodiment of the present invention forms an alignment film 12 for a liquid crystal on a substrate 14 by using ion beam sputtering. Alignment film forming apparatus 10 has a target 16, a transfer table 18, an ion source 20, a mask 22 and a temperature regulator 24. Target 16, ion source 20, mask 22 and temperature regulator 24 are secured in a vacuum chamber (not shown). Transfer table 18 is provided in the vacuum chamber in a movable manner. The degree of vacuum of the vacuum chamber is about $2 \times 10^{-2}$ Pa, for example. Substrate 14 has a rectangular shape of, for example, about 340 mm×470 mm, and has a transparent electrode of ITO (Indium Tin Oxide) or the like formed on a glass substrate.

Target 16 is disposed on or above the top surface side 15 of substrate 14. A sputtering surface 26 of target 16 defines a sharp angle (hereinafter called "target angle") θt to the top surface of substrate 14. Target angle θt is preferably equal to or less than about 60 degrees. Target 16 can be formed of a material containing graphite, carbon or polyimide.

Transfer table 18 transfers substrate 14 in a direction 28 different from the direction in which the normal direction of sputtering surface 26 is projected on the top surface of substrate 14. Transfer table 18 has a recessed lateral cross section and holds the bottom side portion of substrate 14. A columnar roller (not shown) is rotatably provided at the bottom side of transfer table 18, so that the transfer table is movable in the lengthwise direction. A holder (not shown) which holds the top side portion of substrate 14 is provided, so that the substrate stands stably upright in the vertical direction.

Ion source 20 is disposed on or above the top surface side of substrate 14 to irradiate an ion beam 30 on sputtering surface 26 of target 16. When ion beam 30 is irradiated on target 16, sputtering particles 31 are sputtered from the target and deposited on substrate 14, thereby forming a DLC sputtering film 34. Ion source 20 is disposed in such a way that an ion beam 32 is reflected at sputtering surface 26 irradiating sputtering film 34 formed on substrate 14. It is preferable that an irradiation angle θi should be equal to or less than about 45 degrees and equal to or less than the target angle θt, and a particularly suitable irradiation angle is about 25 degrees. Ion source 20 can generate a belt-like ion beam equal to or wider than the width of substrate 14; for example, a Veeco-Ion Tech's linear type argon ion source. An acceleration voltage is preferably about 1500 V or lower, and a particularly suitable acceleration voltage is about 800 V. When acceleration voltage is high, the alignment restricting force becomes weaker. When the acceleration voltage exceeds about 1500 V, sputtering film 34 may be cut off. The ion beam can comprise argon or nitrogen.

Mask 22 is disposed in such a way as to cover a part of the top surface of substrate 14 on an upstream side of a position where the sputtering film is formed. Even if ion beam 30 is scattered, the ion beam is not irradiated on the upstream side of substrate 14.

Temperature regulator 24 regulates the temperature of target 16. Temperature regulator 24 is disposed in contact with the back side of sputtering surface 26. Because the amount of sputtering particles 31 vary according to the temperature of target 16, temperature regulator 24 keeps the target at a predetermined temperature (e.g., 100° C.) by directly supplying heat to the target. Temperature regulator 24 includes a heater, such as a nichrome wire, a temperature sensor and a PID- (Proportional-Integral-Derivative) control circuit. Temperature regulator 24 may serve as a target holder to hold target 16. While temperature regulator 24 is disposed in contact with the back side of sputtering surface 26, the temperature regulator may be disposed apart from the target, so that radiant heat, such as infrared radiation, is supplied to the target.

Next, a method of forming alignment film 12 for a liquid crystal on substrate 14 using alignment film forming apparatus 10 will be described.

First, substrate 14 is placed on transfer table 18, transferred into the vacuum chamber, and transferred in predetermined direction 28 little by little.

Then, ion source 20 irradiates ion beam 30 onto sputtering surface 26 of target 16. Accordingly, sputtering particles 31 sputtered from target 16 are deposited on substrate 14, thereby forming sputtering film 34. As substrate 14 is transferred in predetermined direction 28, ion beam 32 reflected at sputtering surface 26 is irradiated on to sputtering film 34 formed on the substrate. This allows sputtering film 34 to have an orientation. When ion beam 30 is kept irradiated on target 16 while transferring substrate 14, alignment film 12 is formed on the entire top surface of the substrate. Then, substrate 14 whose film deposition has been completed is removed from the vacuum chamber.

According to the embodiment of the present invention, as described above, alignment film 12 can be formed in a single process by simultaneously executing the film deposition process and the alignment process. Both target 16 and ion source 20 are disposed above the surface of substrate 14. Target 16 is disposed in such a way that sputtering surface 26 defines sharp angle θt to the top surface of substrate 14. Ion source 20 irradiates ion beam 30 on sputtering surface 26 of target 16, and ion beam 32 reflected at the sputtering surface is irradiated on sputtering film 34 formed on the substrate, so that the substrate does not block the ion beam irradiated on the target from the ion source. Accordingly, the size of substrate 14 is hardly restricted.

The ion beam method can provide alignment restricting force similar to that provided by the rubbing method, and can provide a more uniform orientation than the rubbing method.

While single irradiation of an ion beam is normally sufficient, if irradiation of an ion beam is performed multiple times with alignment film 12 held in vacuum, the alignment restricting force can be further enhanced.

The foregoing description of the embodiment of the present invention merely illustrates an example of working out the invention. Therefore, the invention is not limited to the above-described embodiment, and the embodiment can be modified as needed without departing from the scope and spirit of the invention.

What is claimed:

1. A method for forming an alignment film for a liquid crystal on a substrate, said method comprising:
   moving the substrate linearly in a first direction differing from a second direction in which a normal direction of a sputtering surface of a target is projected on a first surface side of the substrate, said sputtering surface of the target disposed above the first surface side of the substrate, wherein the target comprises polyimide; and
   propagating only a single ion beam from only one ion source toward the substrate and impinging on the sputtering surface of the target, which sputters a material of the target and results in sputtered particles of the material being emitted from the sputtering surface toward the first surface side of the substrate and deposited on the first surface side of the substrate as the substrate moves linearly in the first direction which results in formation of (i) a sputtering film on and in direct physical contact with the first surface side of the substrate and (ii) an alignment film on the sputtering film and on an entire first surface side of the substrate, wherein the sputtering film is disposed between the first surface side of the substrate and the alignment film, and wherein the ion source is configured for an acceleration voltage in a range of about 800 volts to about 1500 volts for accelerating the ion beam from the ion source to the sputtering surface of the target,
   wherein both the ion source and ion beam face toward and are above the first surface side of the substrate, such that an irradiation angle (θi) equal to or less than 45 degrees is formed between (i) the ion beam propagating from the ion source and (ii) the first surface side of the substrate, and a target angle (θt) equal to or less than 60 degrees is formed between the sputtering surface of the target and the first surface side of the substrate, wherein the irradiation angle (θi) is less than the target angle (θt),
   wherein the moving the substrate in the first direction and the formation of the alignment film occur simultaneously, which results in the sputtering film having an orientation, and
   wherein the alignment film aligns molecules of the liquid crystal in a predetermined direction.

2. The method of claim 1, wherein the irradiation angle (Θi) is equal to or less than 45 degrees and the target angle (Θt) is equal to or less than 60 degrees.

3. The method of claim 1, said method comprising:
   positioning a mask on the first side of the substrate, wherein the mask covers a portion of the first surface side of the substrate side on an upstream side of a position where the sputtering film is formed, wherein the mask is disposed between the substrate and both the target and the ion source, wherein the mask is separated from the substrate, and wherein the mask is solid throughout and is separated from the substrate by a constant distance throughout.

4. The method of claim 1, wherein the acceleration voltage is about 800 volts.

5. The method of claim 1, said method comprising:
   disposing a temperature regulator on, and in direct mechanical contact with, a back surface of the target, wherein the temperature regulator regulates a temperature of the target to be a predetermined temperature, wherein the back surface of the target is parallel to the sputtering surface of the target, wherein the back surface of the target is spatially separated from the sputtering surface of the target by a thickness of the target in a direction perpendicular to the sputtering surface of the target, wherein the temperature regulator fits on a first surface area of the back surface of the target, wherein a total surface area of the back surface of the target consists of the first surface area of the back surface of the target and a remaining surface area of the back surface of the target, and wherein the remaining surface area surrounds the first surface area.

6. The method of claim 5, wherein said moving the substrate comprises moving the substrate by a transfer unit, and wherein said method comprises:
   disposing the substrate, the transfer unit, the ion source, and the temperature regulator within a vacuum chamber in which a degree of a vacuum exits.

* * * * *